United States Patent
Baty

(10) Patent No.: US 10,348,333 B2
(45) Date of Patent: Jul. 9, 2019

(54) TWO BIT ERROR CORRECTION VIA A FIELD PROGRAMMABLE GATE ARRAY

(71) Applicant: EVERSPIN TECHNOLOGIES, INC., Chandler, AZ (US)

(72) Inventor: Kurt Baty, Austin, TX (US)

(73) Assignee: Everspin Technologies, Inc., Chandler, AZ (US)

(*) Notice: Subject to any disclaimer, the term of this patent is extended or adjusted under 35 U.S.C. 154(b) by 68 days.

(21) Appl. No.: 15/711,877

(22) Filed: Sep. 21, 2017

(65) Prior Publication Data
US 2018/0083654 A1    Mar. 22, 2018

Related U.S. Application Data

(60) Provisional application No. 62/398,136, filed on Sep. 22, 2016.

(51) Int. Cl.
| | |
|---|---|
| H03M 13/29 | (2006.01) |
| G11C 29/52 | (2006.01) |
| G06F 11/10 | (2006.01) |
| H03M 13/05 | (2006.01) |

(52) U.S. Cl.
CPC ..... *H03M 13/2906* (2013.01); *G06F 11/1068* (2013.01); *G11C 29/52* (2013.01); *H03M 13/05* (2013.01)

(58) Field of Classification Search
CPC .................................................. H03M 13/2959
See application file for complete search history.

(56) References Cited

U.S. PATENT DOCUMENTS

| | | | | |
|---|---|---|---|---|
| 4,509,172 A | | 4/1985 | Chen | |
| 4,525,754 A | * | 6/1985 | Handley | ................ G11B 20/10 360/51 |
| 5,371,870 A | * | 12/1994 | Goodwin | ............ G06F 12/0862 710/52 |
| 5,388,247 A | * | 2/1995 | Goodwin | ................ G06F 9/383 711/136 |
| 5,452,418 A | * | 9/1995 | Tatosian | .............. G06F 11/1008 711/117 |
| 6,636,221 B1 | * | 10/2003 | Morein | .................. G09G 5/363 345/505 |

* cited by examiner

*Primary Examiner* — Fritz Alphonse
(74) *Attorney, Agent, or Firm* — Bookoff McAndrews, PLLC

(57) ABSTRACT

Apparatus, methods, and systems are disclosed for performing bit error correction on a data stream. In some aspects, the described systems and methods may include a plurality of memory devices, a first interface, and a field programmable gate array. The field programmable gate array may include a memory controller and a plurality of re-programmable gates. At least one of the re-programmable gates may be configured as a read-only memory (ROM) to store a syndrome decode memory table, wherein the syndrome decode memory table may be configured to perform bit error correction on the data stream being read and/or written to at least one memory device of the plurality of memory devices via the first interface.

20 Claims, 10 Drawing Sheets

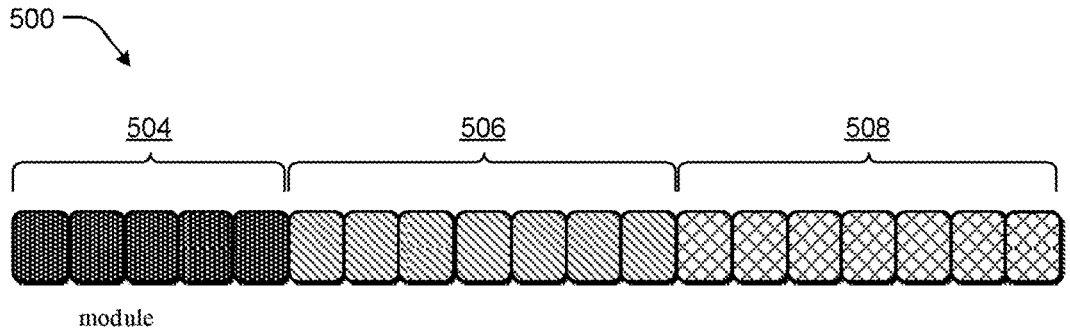

```
module

Hamming_144_128_syndrome_decode_ROM (syndrome,no_error,correctable_error,
    num_of_bits_in_error,syndrome_decoded_inversions,uncorrectable_error);

input   [15:0]   syndrome;          ← 502
output           no_error;
output           correctable_error;
output  [1:0]    num_of_bits_in_error;
output  [127:0]  syndrome_decoded_inversions;
output           uncorrectable_error;

wire             no_error;
wire             correctable_error;
wire    [1:0]    num_of_bits_in_error;
wire    [127:0]  syndrome_decoded_inversions;
wire             uncorrectable_error;

reg     [18:0]   syndrome_decode_ROM [0:65535];

wire             bit_correct_enable0,bit_correct_enable1;
wire    [6:0]    bit_index0,bit_index1;

initial begin
    $readmemh("code_ROM_hex.txt",syndrome_decode_ROM);
end assign no_error = ~|syndrome;
assign {correctable_error, num_of_bits_in_error,
        bit_correct_enable1,bit_index1,
        bit_correct_enable0,bit_index0} =
        syndrome_decode_ROM[syndrome];
assign uncorrectable_error = !no_error && !correctable_error;
assign syndrome_decoded_inversions =
       ({127'b0,bit_correct_enable1} << bit_index1)
       ^({127'b0,bit_correct_enable0} << bit_index0);

endmodule
```

FIG. 5

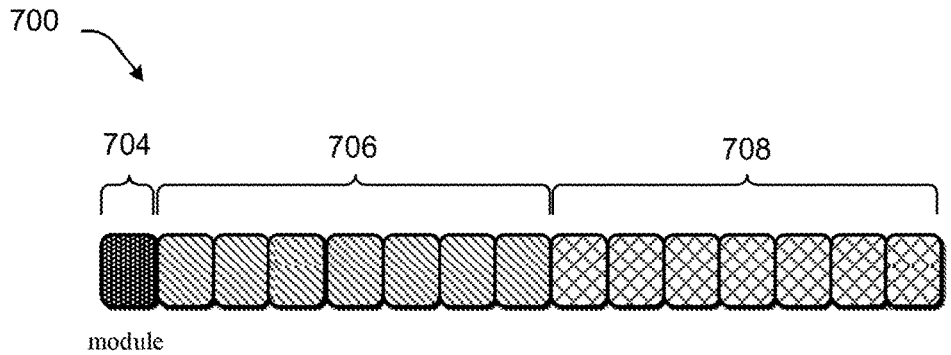

```
module

Hamming_144_128_syndrome_decode_ROM (syndrome,no_error,correctable_error,
num_of_bits_in_error,syndrome_decoded_inversions,uncorrectable_error);

input    [15:0]  syndrome;                       702
output           no_error;
output           correctable_error;
output   [1:0]   num_of_bits_in_error;
output   [127:0] syndrome_decoded_inversions;
output           uncorrectable_error;

wire             no_error;
wire             correctable_error;
wire     [1:0]   num_of_bits_in_error;
wire     [127:0] syndrome_decoded_inversions;
wire             uncorrectable_error;
wire             two_correctable_data_bits;

reg      [14:0]  syndrome_decode_ROM [0:65535];

wire             bit_correct_enable0,bit_correct_enable1;
wire     [6:0]   bit_index0,bit_index1;

initial begin
    $readmemh("code_ROM2_hex.txt",syndrome_decode_ROM);
end assign no_error = ~|syndrome;

assign {two_correctable_data_bits,bit_index1,bit_index0} = syndrome_decode_ROM[syndrome];

assign {correctable_error,num_of_bits_in_error,bit_correct_enable1,bit_correct_enable0}
     = (two_correctable_data_bits)? {1'b1,2'b10,1'b1,1'b1}: bit_index1[6:2];
                                                                                   710
assign uncorrectable_error = !no_error && !correctable_error;

assign syndrome_decoded_inversions =
         ({127'b0,bit_correct_enable1} << bit_index1)
       ^ ({127'b0,bit_correct_enable0} << bit_index0);

endmodule
```

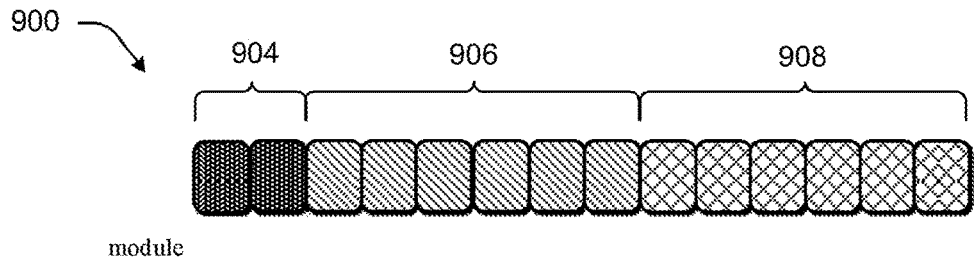

module

Hamming_144_128_syndrome_decode_ROM (syndrome,no_error,correctable_error,
    num_of_bits_in_error,syndrome_decoded_inversions,uncorrectable_error);

input    [15:0]   syndrome;   ← 902 output            no_error;
output            correctable_error;
output   [1:0]    num_of_bits_in_error;
output   [127:0]  syndrome_decoded_inversions;
output            uncorrectable_error;

wire              no_error;
wire              correctable_error;
wire     [1:0]    num_of_bits_in_error;
wire     [127:0]  syndrome_decoded_inversions;
wire              uncorrectable_error;
wire     [1:0]    decode_state;
wire              two_correctable_data_bits;                       ← 910 reg      [13:0]   syndrome_decode_ROM [0:65535];

wire              bit_correct_enable0,bit_correct_enable1;
wire     [6:0]    bit_index0,bit_index1;

initial begin
    $readmemh("code_ROM3_hex.txt",syndrome_decode_ROM);
end assign no_error = ~|syndrome;
assign {decode_state[1],bit_index1[5:0],decode_state[0],bit_index0[5:0]} =
    syndrome_decode_ROM[syndrome];

assign two_correctable_data_bits = |decode_state;
assign bit_index1[6] = (two_correctable_data_bits)? !decode_state[1] : 1'b0;
assign bit_index0[6] =
    (two_correctable_data_bits)? decode_state[0] : bit_index1[1] && bit_index1[0];
assign {correctable_error,num_of_bits_in_error,bit_correct_enable1,bit_correct_enable0}
    = (two_correctable_data_bits)? {1'b1,2'b10,1'b1,1'b1} : bit_index1[5:1];   ← 912
assign uncorrectable_error = !no_error && !correctable_error;
assign syndrome_decoded_inversions = ({127'b0,bit_correct_enable1} << bit_index1)
    ^ ({127'b0,bit_correct_enable0} << bit_index0);

endmodule

FIG. 9

TWO BIT ERROR CORRECTION VIA A FIELD PROGRAMMABLE GATE ARRAY

CROSS REFERENCE TO RELATED APPLICATIONS

This application claims the benefit of priority to U.S. Provisional Application No. 62/398,136, filed Sep. 22, 2016, the entire contents of which is herein incorporated by reference.

TECHNICAL FIELD

Embodiments of the present disclosure relate to, among other things, implementing two-bit error correction via a field programmable gate array.

BACKGROUND

In general, memory devices may be used to store data in a computing system. In some cases, memory may be added to the computing system via a peripheral component interconnect express (PCIE) slot. PCIE is a serial computer expansion bus standard that permits high-speed communication between a host and peripheral components. The memory may be added to the computing system by installing a PCIE card that includes the added memory and a field programmable gate array (FPGA).

Memory devices are generally designed with no more than two-bit error correction. And, in some cases, the two-bit error correction may be performed by the FPGA of the PCIE card. However, in some cases, performing the two-bit error correction within the re-programmable gates of the FPGA of the PCIE card may fail to maintain desired data stream rates when performing the two-bit error correction.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

FIG. 5 illustrates a diagram showing an example scheme and associated code that may be used to access a syndrome decode memory table, according to one aspect of the present disclosure.

FIG. 7 illustrates another diagram showing an example scheme and associated code that may be used to access a syndrome decode memory table, according to another aspect of the present disclosure.

FIG. 9 depicts yet another diagram showing an example scheme and associated code that may be used to access a syndrome decode memory table, according to another aspect of the present disclosure.

Figure 1:
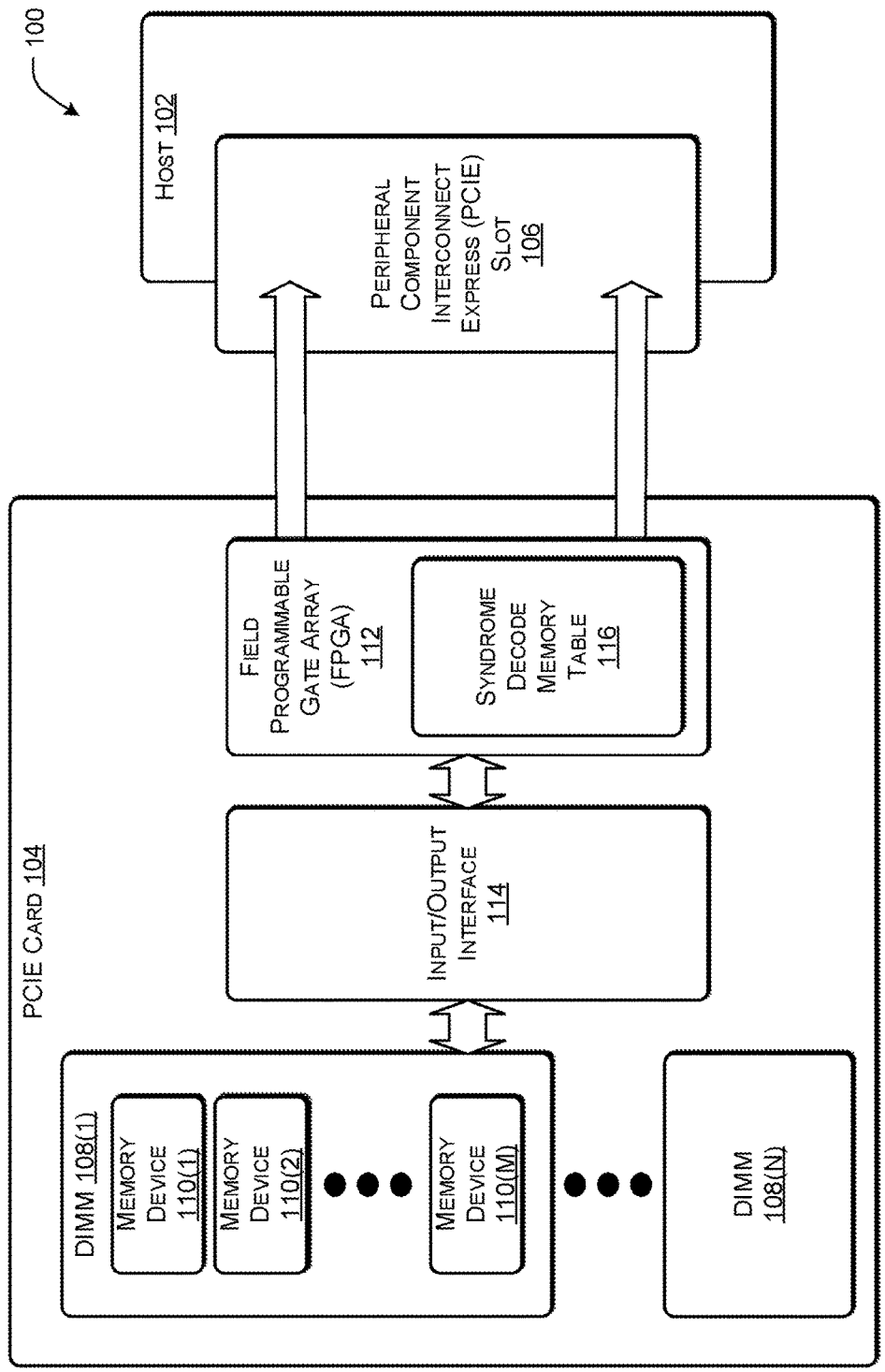
FIG. 1 illustrates a block diagram showing select components of an example electronic device, e.g., a host computer, interfacing with an external memory device, according to one aspect of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

Bit Error Correction Via a Field-Programmable Gate Array (FPGA)

In one aspect, the present disclosure is directed to techniques and implementations for performing memory two-bit error correction via a field-programmable gate array (FPGA) on a peripheral component interconnect express (PCIE) card.

Turning to FIG. 1, there is depicted a block diagram 100 showing select components of an example electronic device, such as, e.g., computing system or host 102 interfacing with a PCIE card 104 via a PCIE slot 106, according to some implementations. In the illustrated example, the PCIE card 104 includes multiple dual in-line memory modules (DIMMS) 108(1)-108(N). Each of the DIMMS 108(1)-(N) also may include multiple memory devices 110(1)-(M), thereby forming a memory sub-system.

In the illustrated example, the PCIE card 104 is releasably coupled to the PCIE slot 106 of host 102. The PCIE slot 106 of host 102 is coupled to the DIMMS 108(1)-(N) via a FPGA 112 and an input output/interface 114 of the PCIE card 104.

In some embodiments, FPGA 112 may be configured to perform read and/or write operations via the one or more input/output interfaces 114. For example, the FPGA 112 may be programmed to interface with the PCIE card 104 to perform read and/or write operations via the one or more input/output interfaces 114 on the memory devices 110(1)-(M). The FPGA 112 may include random access memories (RAMs), which may be used as re-programmable gates to perform combinatorial logical operations associated with bit error correction. The bit error correction may be performed when reading and/or writing data to and from the PCIE card 104. However, in this example, the RAMs may be configured as a read-only memory (ROM) to store a syndrome decode memory table 116. In some embodiments, the syndrome decode memory table 116 may be configured to improve the speed at which the bit error correction may be performed within the FPGA 112. By improving the speed at which the bit error correction is performed, proper read/write speeds may be maintained with respect to the data received from and sent to one or more input/output interfaces 114.

Figure 2:
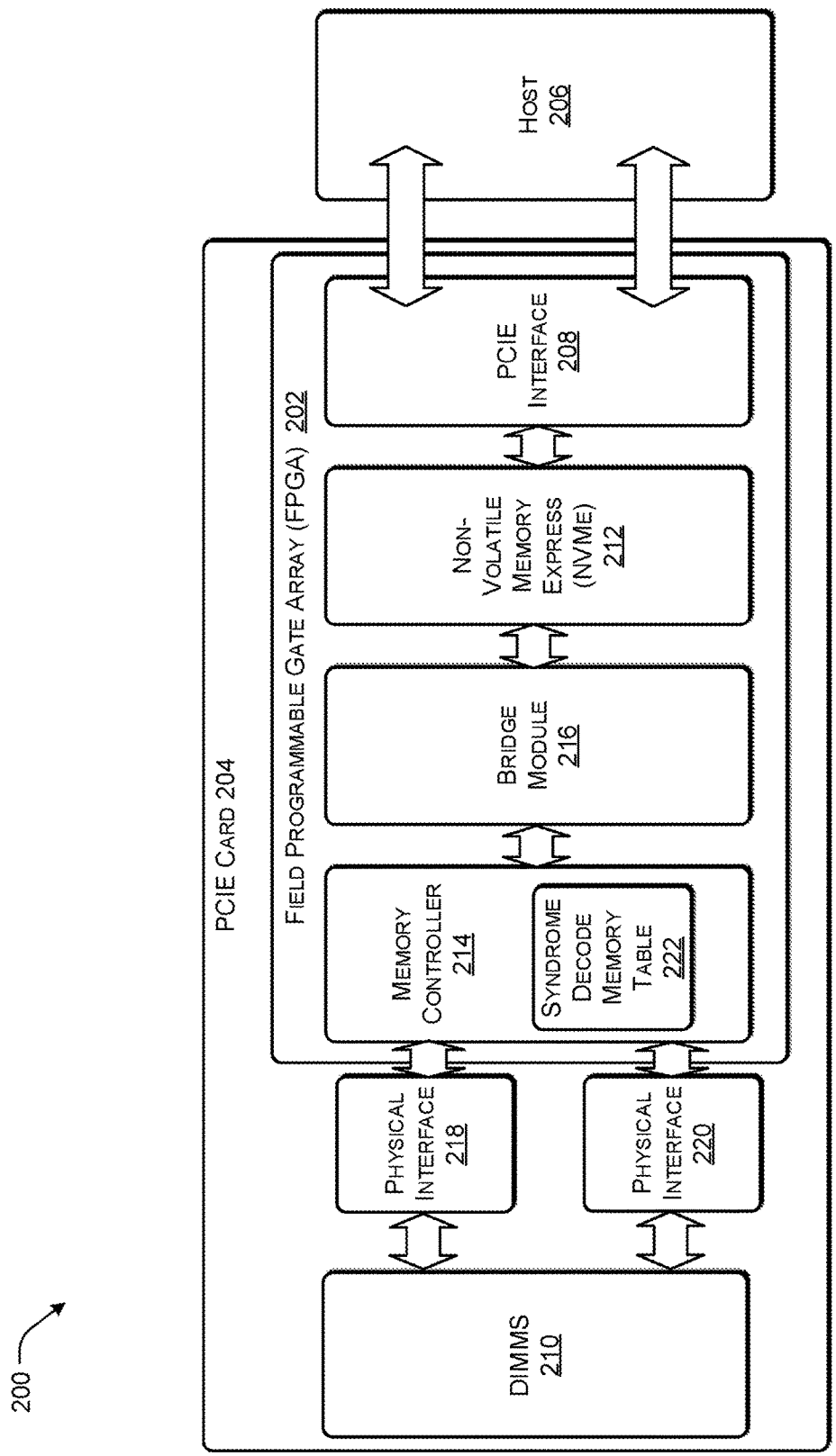
FIG. 2 illustrates a block diagram showing select components of an example Field Programmable Gate Array (FPGA), according to one aspect of the present disclosure.

Turning now to FIG. 2, there is depicted a block diagram 200 showing select components of an example FPGA 202, according to some embodiments of the present disclosure. For instance, as described above, a PCIE card 204 may be releasably coupled to a PCIE slot of a host 206 via a PCIE interface 208 on the PCIE card 204. The PCIE card 204 may include one or more DIMMS 210, each having one or more memory devices. The host 206 may be coupled to non-volatile memory express (NVMe) stack 212 of the FPGA 202. In some embodiments, the NVMe stack 212 may be configured to detect the coupling of the PCIE card 204 to the PCIE slot of host 206 via the PCI interface 208. The NVMe stack 212 may also be configured to access the embedded software on the PCIE card 204 to determine whether the PCIE card 204 includes non-volatile memory to, e.g., be added to host 206 or otherwise operably couple with host 206.

The NVMe stack 212 may be further coupled to a memory controller 214 via a bridge module 216. The memory controller 214 may be coupled to one or more DIMMS 210 via one or more physical interfaces, such as, e.g., physical interfaces 218 and/or 220. The physical interfaces 218 and 220 may be configured to receive commands and/or transfer data to and from the PCIE card 204 and other components of host 206, which may include, or is operably coupled to, one or more electronic devices. The memory controller 214 includes a read-data path and a write-data path that utilize RAMs of the memory controller 214 to perform bit error correction on the data being transferred. In some embodiments, the memory controller 214 may include a syndrome decode memory table 222 that may replace the combinational logic typically used in FPGAs and PCIE cards. The syndrome decode memory table 222 may be configured to improve the speed at which bit error correction on the data being written into the PCIE card 204 may be processed. The operations associated with the memory controller 214 will be described in more detail below with respect to FIGS. 3 and 4.

Encoding Data During a Read Operation

Figure 3:
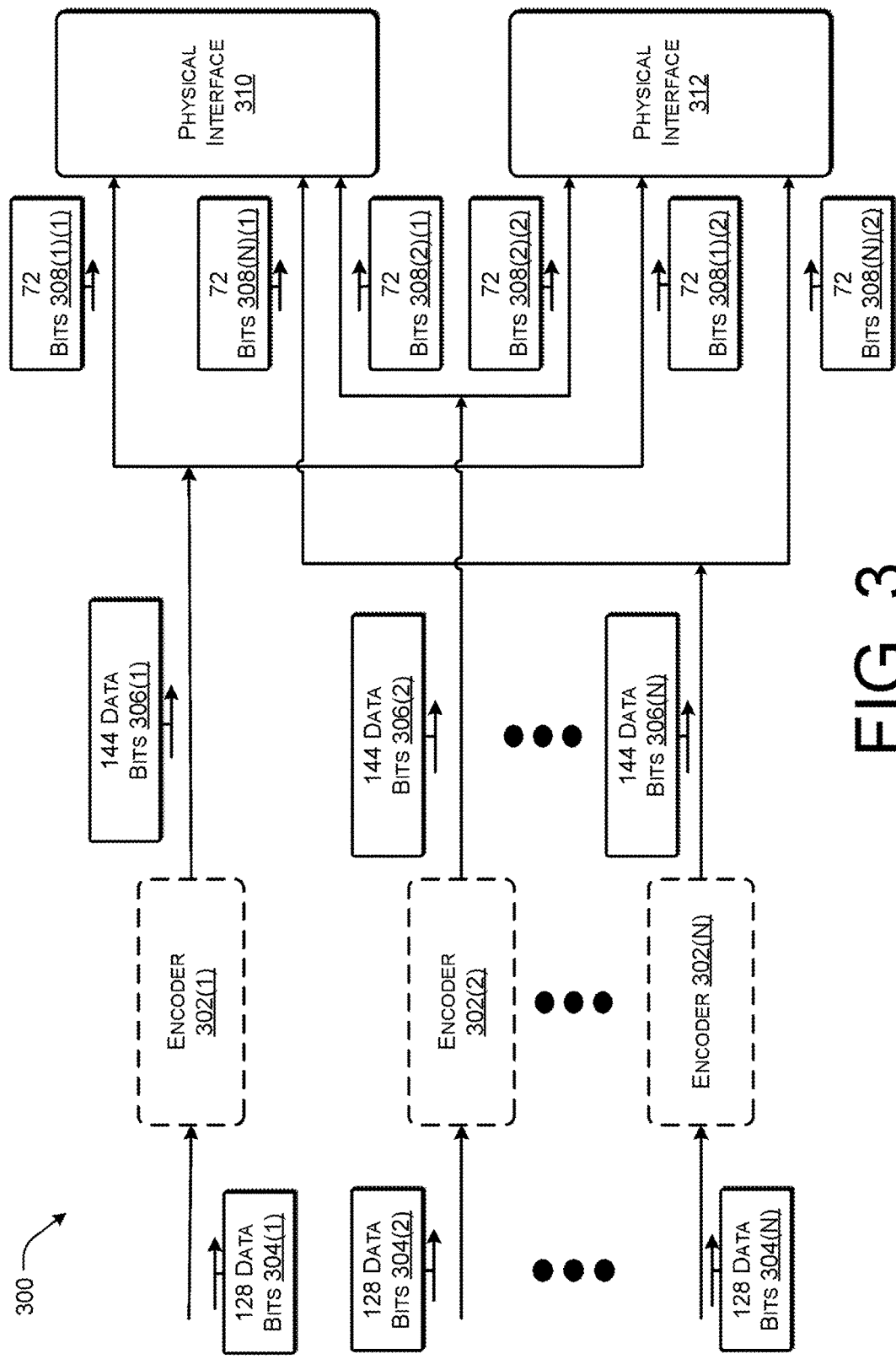
FIG. 3 illustrates a block diagram showing an example memory controller of a FPGA during a read operation, according to one aspect of the present disclosure.

Turning now to FIG. 3, there is depicted a block diagram showing an example memory controller 300 of an FPGA during a read operation, according to some embodiments. The memory controller 300 may include multiple encoders 302(1)-(N), each of which may be configured to encode 128 bits of data, generally indicated by 304(1)-(N), being read from a host (such as, e.g., host 206 via PCIE interface 208, as discussed above with reference to FIG. 2). Each of the multiple encodes 302(1)-(N) may perform two-bit error correction on the corresponding 128 bits of data 304(1)-(N), thereby generating a first 16-bit error encryption code. The first 16-bit error encryption code may be appended onto each of the 128 bits of data. Thus, the output of each encoder is 144 bits wide, generally indicated by 306(1)-(N). Half of each of the 144 bits (e.g., 72 bits 308(1)(1)-(N)(2)) may be provided to one of the physical interfaces 310 or 312 (or physical interfaces 218 or 220, as discussed above with reference to FIG. 2), such that each of the physical interfaces 310 or 312 (or physical interfaces 218 or 220) receive 72 bits, which may be output to other components of the PCIE card 204, such as to, e.g., one or more DIMMS 210 (as discussed above with reference to FIG. 2).

Decoding Data During a Write Operation

Figure 4:
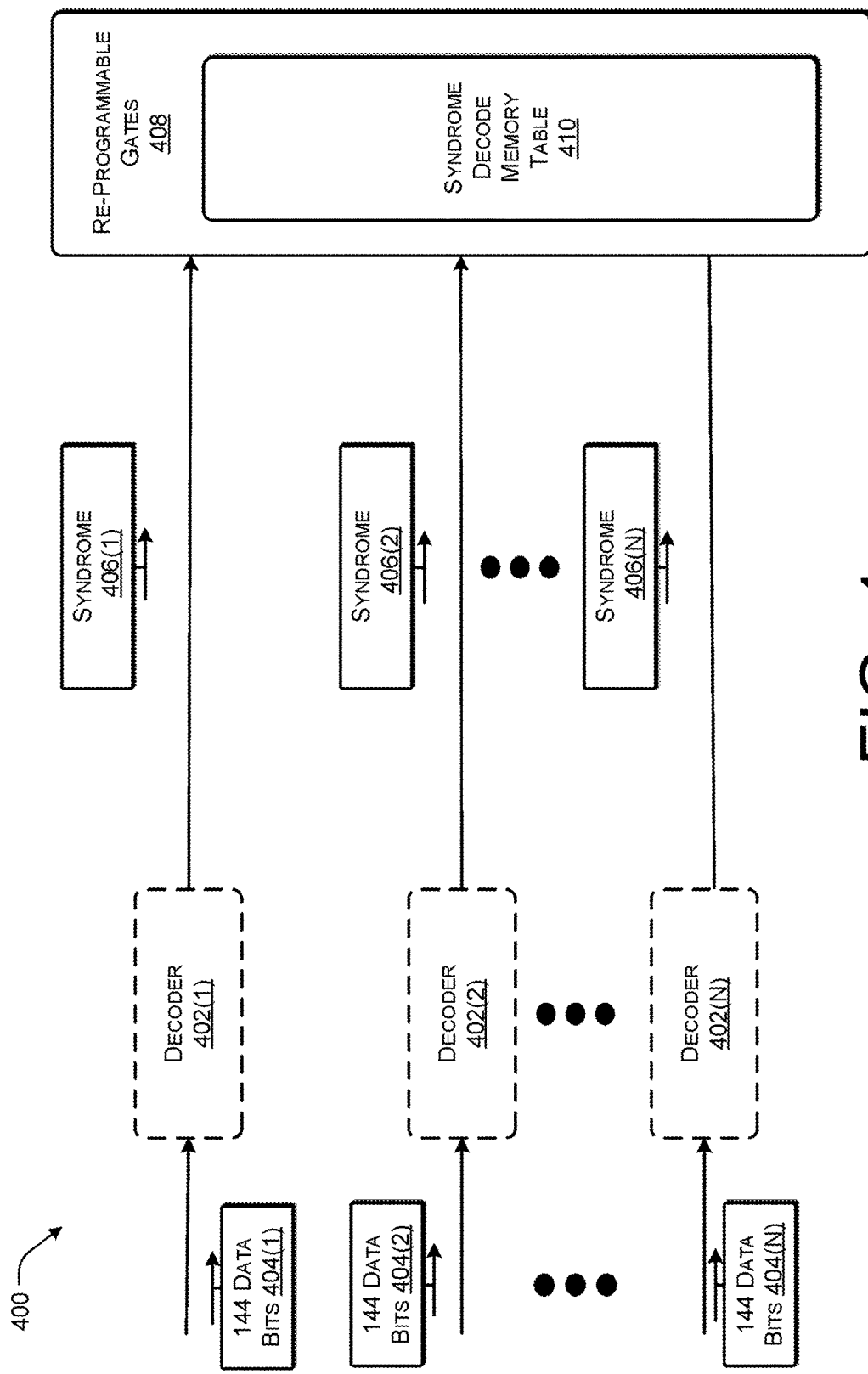
FIG. 4 illustrates a block diagram showing an example memory controller of a FPGA during a write operation, according to one aspect of the present disclosure.

Turning now to FIG. 4, there is depicted a block diagram showing an example memory controller 400 of an FPGA during a write operation, according to some embodiments. During the write operation, one or more decoders 402(1)-(N) within the memory controller 400 each receive 144 bits of data, generally indicated by 404(1)-(N), from the physical interfaces (such as physical interfaces 218 or 220, discussed above with reference to FIG. 2). Each of the decoders 402(1)-(N) takes the 128 bits of the corresponding 144 bits 404(1)-(N) representing the data bits and re-encodes the 128 bits generating a second 16-bit error encryption code. Each of the decoders 402(1)-(N) then performs an Exclusive OR (XOR) operation of the first 16-bit error encryption code (generated by each of the encoders 302 (1)-(N) described above with reference to FIG. 3) with the second 16-bit error encryption code (generated by each of the decoders 402(1)-(N)) to generate a 16-bit syndrome, generally indicated by syndromes 406(1)-(N). Exclusive OR (XOR) is a logical operation that outputs TRUE (or "1") when inputs differ (e.g., one input is TRUE (or "1"), and the other input is FALSE (or "0")). Thus, each of the decoders 402(1)-(N) generates each of the 16-bit syndromes 406(1)-(N).

In some cases, memory controller 400 may include four decoders generating four 16-bit wide syndromes, or eight decoders generating eight 16-bit wide syndromes. Each of the syndromes 406(1)-(N) may be processed within a predetermined period of time, such as within a window of a few nanoseconds (depending on the computing system clock rate), to maintain optimal data stream rates between the host 206 and the PCIE card. However, in some cases, the FPGAs may be unable to process the number of bits within the predetermined period of time using its combinatorial logic and re-programmable gates 408. Therefore, described herein is an implementation of programming the re-programmable gates 408 into a ROM to allow memory controller 400 to perform the two-bit error correction on the data received from the physical interfaces within a desired time period, which may be the predetermined period of time.

In some examples, the results generated by using combinatorial logic to process the 16-bit syndromes may be stored as a ROM in the re-programmable gates 408 of the FPGA. Thus, the ROM may be utilized as a syndrome decode memory table 410 that may replace the logic typically stored on the re-programmable gates 408. In one example described herein, the syndrome decode memory table 410 may be addressable by one or more of the syndromes 406(1)-(N) to generate an output that identifies up to two correctable bits.

It should be appreciated that the size and access speeds of the syndrome decode memory table 410 may vary depending on the implementation. FIGS. 5-10, described below, provide three example schemes and associated code that may be used to access the syndrome decode memory table 410.

Nineteen-Bit ECC Output by a Syndrome Decode Memory Table

Turning now to FIG. 5, there is depicted a diagram showing an example scheme and associated code that may be used to access a syndrome decode memory table 500. In this example, the syndrome decode memory table 500 may be addressable by the 16-bit syndrome, generally indicated by input [15:0] 502 in the code excerpt, generated by one or more decoders, such as, e.g., decoders 402(1)-(N) of FIG. 4. In this example, the syndrome decode memory table 410 stored as a ROM in the FPGA may output nineteen signals that are usable by an ECC (error-correcting code) component. In the current example, the nineteen output signals include five indicator signals, generally indicated by 504. The indicator signals 504 in this example include a first signal indicating if the error is correctable, a second and third signal to indicate the number of bits in error, a fourth signal representing a first bit correct enable signal, and a fifth signal representing a second bit correct enable signal. The nineteen output signals may also include a first set of seven index bits 506 to indicate the location of the first error in the 128 bits of data, and a second set of index bits 508 to indicate the location of the second error in the 128 bits of data. Thus, the ROM storing the syndrome decode memory table 410 may be as large as 1,245,184 bits (($2^{16}$=65,536)× 19 bits=1,245,184 ROM size in bits) to accommodate each of the bit errors indicated by each possible syndrome generated by the decoders.

Figure 6:
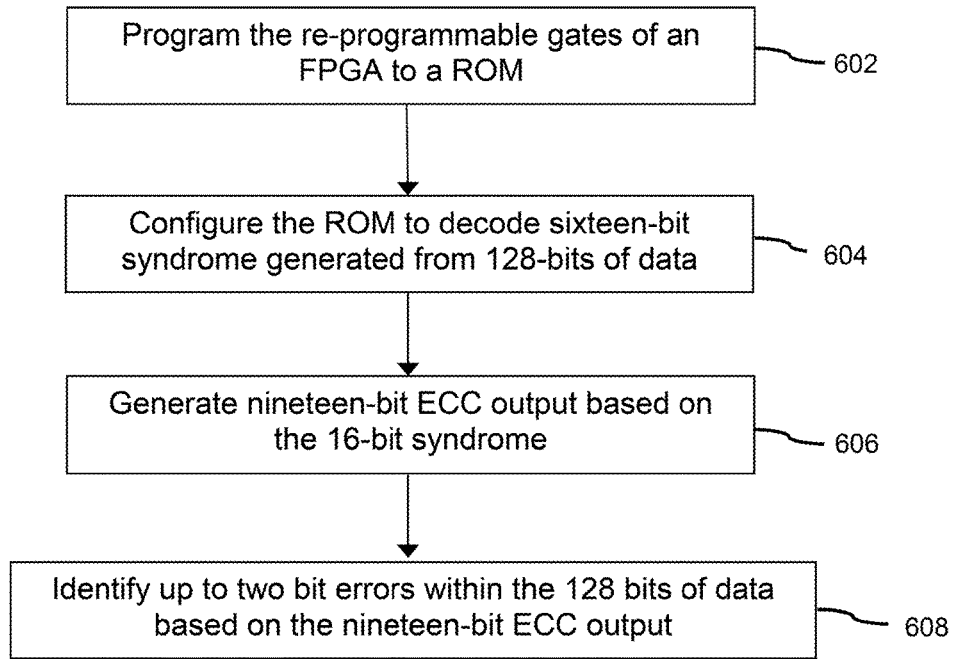
FIG. 6 depicts a flowchart of steps of one example of decoding bit errors, according to one aspect of the present disclosure.

With reference now to FIG. 6, there is depicted a method 600 for using an FPGA to identify up to two correctable bit errors within 128 bits of data. As explained in further detail below, method 600 may include, but is not limited to, programming the re-programmable gates of an FPGA as a ROM to generate a nineteen-bit ECC output and identify up to two correctable bit errors within the 128 bits of data. Method 600 is illustrated as a collection of blocks in a logical flow diagram, which represents a sequence of operations, some or all of which may be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures, and environments described in the examples herein, although the processes may be implemented in a wide variety of other frameworks, architectures, or environments.

Method 600 may begin with programming the re-programmable gates of a FPGA to a ROM (step 602). As discussed above with reference to FIG. 2, the ROM may be configured to include a memory controller and a syndrome decode memory table. In some embodiments, the memory controller may be configured to process (e.g., read and/or write) groupings of data (128-bits wide) from a memory in a computing system. As discussed above with reference to FIG. 4, the memory controller may be configured to decode the 128-bit wide groupings of data to generate 16-bit syndromes. In turn, each of the 16-bit syndromes may be leveraged to identify up to two correctable error bits within each of the 128-bit wide groupings of data. In step 604, the ROM may be configured to include a syndrome decode memory table. In some embodiments, the syndrome decode memory table may be configured to decode each of the 16-bit syndromes generated from the 128-bit wide groupings of data. In step 606, the syndrome decode memory table may generate a nineteen-bit ECC output for identifying up to two correctable error bits within each of the 128-bit wide groupings of data. As discussed above with reference to FIG. 5, the nineteen-bit ECC output may include five indicator signals (e.g., indicator signals 504), a first set of seven index bits (e.g., index bits 506), and a second set of index bits (e.g., index bits 508). In step 608, up to two correctable bit errors within the 128-bit wide groupings of data may be identified from the nineteen-bit ECC output.

Fifteen-Bit ECC Output by a Syndrome Decode Memory Table

Turning now to FIG. 7, there is depicted another diagram showing another example scheme and associated code that may be used to access a syndrome decode memory table 700. In some instances, though not always the case, the scheme of FIG. 7 may be relatively more efficient than other schemes described herein. In this example, the syndrome decode memory table 700 may be similarly addressable by the 16-bit syndrome, generally indicated by input [15:0] 702 in the code excerpt, generated by one or more decoders, such as, e.g., decoders 402(1)-(N) of FIG. 4. However, in the current example, the syndrome decode memory table 700 may output as few as fifteen signals. The fifteen signals may include a single indicator signal 704 representing if two correctable errors have occurred. The fifteen signals also includes a first set of seven index signals 706 and a second set of seven index signals 708.

In this instance, less than the nineteen bits of FIG. 5 may be used because in cases in which less than two correctable errors have occurred, the second set of seven index signals 708 remain unused and may instead be assigned to represent the number of bits in error. Also, the second set of seven index signals 708 may be configured to determine whether the error is correctable or uncorrectable, as generally indicated by code line 710. As the number of indictor signals that are output by the syndrome decode memory table 700 are reduced, the total size of the ROM stored in the FPGA may also be reduced to 983,040 bits (($2^{16}$=65,536)×15 bits=983,040 ROM size in bits). Thus, the syndrome decode memory table 700 may be more compressed than the syndrome decode memory table 500, thereby improving the efficiency by which error correction may be performed when writing and/or reading data to the memory devices on the PCIE card.

Figure 8:
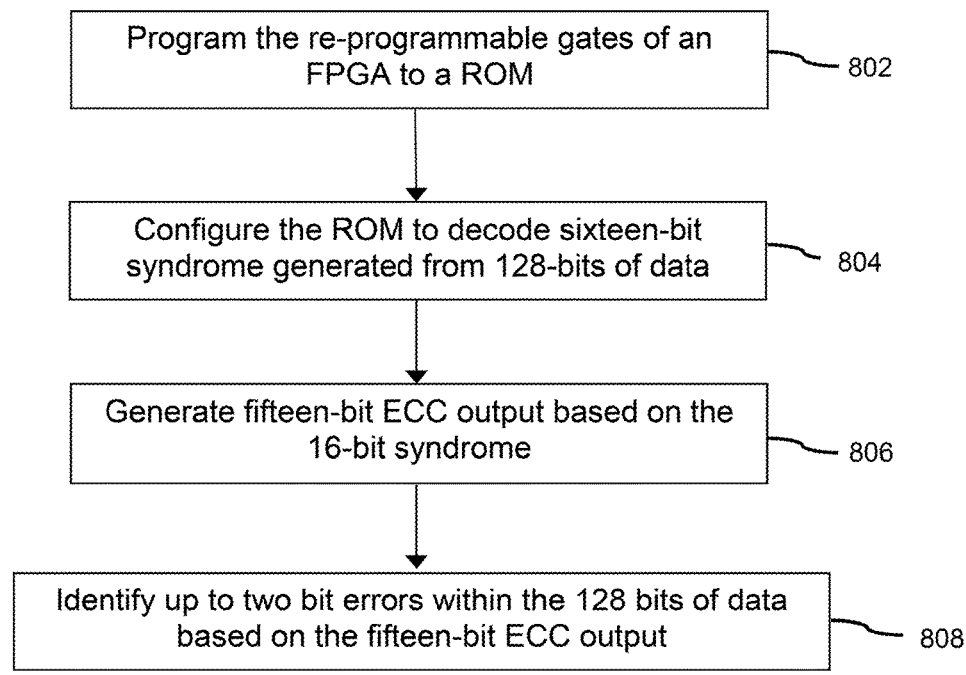
FIG. 8 depicts a flowchart of steps of one example of decoding bit errors, according to another aspect of the present disclosure.

With reference now to FIG. 8, there is depicted a method 800 for using an FPGA to identify up to two correctable bit errors within 128 bits of data. As explained in further detail below, method 800 may include, but is not limited to, programming the re-programmable gates of an FPGA as a ROM to generate a fifteen-bit ECC output and identify up to two correctable bit errors within the 128 bits of data. Method 800 is illustrated as a collection of blocks in a logical flow diagram, which represents a sequence of operations, some or all of which may be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures, and environments described in the examples herein, although the processes may be implemented in a wide variety of other frameworks, architectures, or environments.

Method 800 may begin with programming the re-programmable gates of a FPGA to a ROM (step 802). As discussed above with reference to FIG. 2, the ROM may be configured to include a memory controller and a syndrome decode memory table. In some embodiments, the memory controller may be configured to process (e.g., read and/or write) groupings of data (128-bits wide) from a memory in a computing system. As discussed above with reference to FIG. 4, the memory controller may be configured to decode the 128-bit wide groupings of data to generate 16-bit syndromes. In turn, each of the 16-bit syndromes may be leveraged to identify up to two correctable error bits within each of the 128-bit wide groupings of data. In step 804, the ROM may be configured to include a syndrome decode memory table. In some embodiments, the syndrome decode memory table may be configured to decode each of the 16-bit syndromes generated from the 128-bit wide groupings of data. In step 806, the syndrome decode memory table may generate a fifteen-bit ECC output for identifying up to two correctable error bits within each of the 128-bit wide groupings of data. As discussed above with reference to FIG. 7, the fifteen-bit ECC output may include one indicator signal (e.g., indicator signal 704), a first set of seven index bits (e.g., index bits 706), and a second set of seven index bits (e.g., index bits 708). In step 808, up to two correctable bit errors within the 128-bit wide groupings of data may be identified from the fifteen-bit ECC output.

Fourteen-Bit ECC Output by a Syndrome Decode Memory Table

Turning now to FIG. 9, there is depicted another diagram showing another example scheme and associated code that may be used to access a syndrome decode memory table 900. In some instances, though not always the case, the scheme of FIG. 9 may be relatively more efficient than the scheme of FIG. 7. In this example, the syndrome decode memory table 900 may be similarly addressable by the 16-bit syndrome, generally indicated by input [15:0] 902 in the code excerpt 910, generated by one or more decoders, such as, e.g., decoders 402(1)-(N) of FIG. 4. However in the current example, the syndrome decode memory table 900 may output as few as fourteen signals. Initially, in this example, the syndrome decode memory table 900 may be arranged in a descending order with the lowest value occupying the first row within the syndrome decode memory table 900. The fourteen signals may include two indicator signals 904, as well as a first set of six index signals 906 and a second set of six index signals 908. Thus, the ROM stored in the FPGA may have a reduced size of 917,504 bits (($2^{16}$=65,536)×14 bits=917,504 ROM size in bits), thus further improving the efficiency by which error correction may be performed when writing and/or reading data to the memory devices on the PCIE card.

As the code excerpt 910 is used to access the syndrome decode memory table 900, the second error may be considered to occur to the left of the first error, as illustrated in Table A reproduced below. Thus, the first indicator and the second indicator signal may be used in combination to indicate the location of the first correctable error and the second correctable error. For example, as illustrated in the Table A below, if the first indicator signal is set to a value of 0 and the second indictor signal is set to a value of 1, then the location of the first correctable error is within data bits [0:63] and the location of the second correctable error is also within data bits [0:63]. Similarly, if the first indicator signal is set to a value of 1 and the second indictor signal is set to a value of 1, then the location of the first correctable error is within data bits [64:127] and the location of the second correctable error is also within data bits [0:63], e.g., to the left of the first correctable error. Finally, if the first indicator signal is set to a value of 1 and the second indictor signal is set to a value of 0, then the location of the first correctable error is within data bits [64:127] and the location of the second correctable error is also within data bits [64:127].

TABLE A

| First Indicator Signal | Second Indicator Signal | Location of first correctable error | Location of second correctable error |
|---|---|---|---|
| 0 | 1 | 0 to 63 | 0 to 63 |
| 1 | 1 | 64 to 127 | 0 to 63 |
| 1 | 0 | 64 to 127 | 64 to 127 |

Because the code excerpt 910 assigns the left-most error as the second correctable error, the situation in which the second correctable error occurs within the data bits [64:127] and the location of the first correctable error occurs within data bits [0:63] does not occur. Thus, setting the first indicator signal to a value of 0 and the second indictor signal to a value of 0, may represent the remainder cases in which: a single correctable error has occurred; the error is uncorrectable; more than two correctable errors have occurred; and/or the situation in which no errors have occurred, as generally indicated by code line 912.

Figure 10:
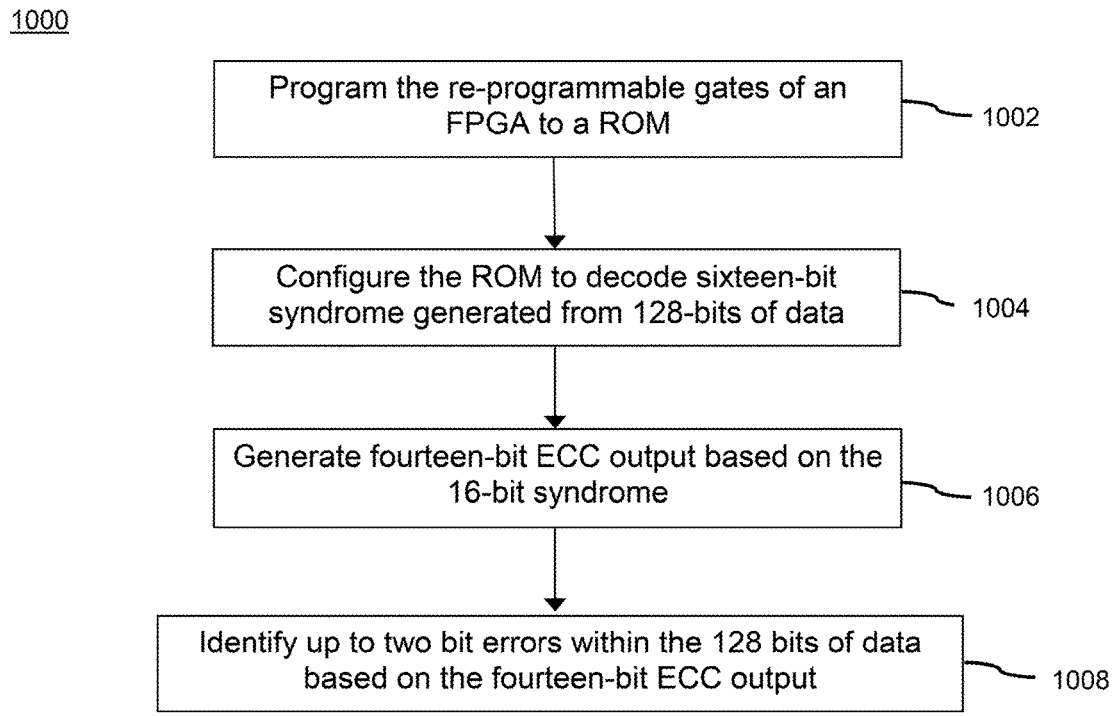
FIG. 10 depicts a flowchart of steps of one example of decoding bit errors, according to another aspect of the present disclosure.

With reference now to FIG. 10, there is depicted a method 1000 for using an FPGA to identify up to two correctable bit errors within 128 bits of data. As explained in further detail below, method 1000 may include, but is not limited to, programming the re-programmable gates of an FPGA as a ROM to generate a fourteen-bit ECC output and identify up to two correctable bit errors within the 128 bits of data. Method 1000 is illustrated as a collection of blocks in a logical flow diagram, which represents a sequence of operations, some or all of which may be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures, and environments described in the examples herein, although the processes may be implemented in a wide variety of other frameworks, architectures, or environments.

Method 1000 may begin with programming the re-programmable gates of a FPGA to a ROM (step 1002). As discussed above with reference to FIG. 2, the ROM may be configured to include a memory controller and a syndrome decode memory table. In some embodiments, the memory controller may be configured to process (e.g., read and/or write) groupings of data (128-bits wide) from a memory in a computing system. As discussed above with reference to FIG. 4, the memory controller may be configured to decode the 128-bit wide groupings of data to generate 16-bit syndromes. In turn, each of the 16-bit syndromes may be leveraged to identify up to two correctable error bits within each of the 128-bit wide groupings of data. In step 1004, the ROM may be configured to include a syndrome decode memory table. In some embodiments, the syndrome decode memory table may be configured to decode each of the 16-bit syndromes generated from the 128-bit wide groupings of data. In step 1006, the syndrome decode memory table may generate a fourteen-bit ECC output for identifying up to two correctable error bits within each of the 128-bit wide groupings of data. As discussed above with reference to FIG. 9, the fourteen-bit ECC output may include two indicator signals (e.g., indicator signals 904), a first set of six index bits (e.g., index bits 906), and a second set of six index bits (e.g., index bits 908). In step 1008, up to two correctable bit errors within the 128-bit wide groupings of data may be identified from the fourteen-bit ECC output.

Certain embodiments of the aspects described above provide for systems and devices to effectively perform two-bit error correction on a data stream being read and/or written to a plurality of memory devices.

According to certain embodiments, methods and devices are disclosed for performing bit error correction on a data stream. One example device includes a plurality of memory devices; a first interface; and a field programmable gate array, wherein the field programmable gate array comprises a memory controller and a plurality of re-programmable gates, wherein the re-programmable gates may be configured as a read-only memory (ROM) to store a syndrome decode memory table, and wherein the syndrome decode memory table is configured to perform bit error correction on the data stream being read and/or written to the plurality of memory devices via the first interface.

According to certain embodiments, systems are disclosed for performing bit error correction on a data stream. One example system includes a host; a plurality of memory devices; a first interface; a second interface; and a field programmable gate array, wherein the field programmable gate array comprises a memory controller and a plurality of re-programmable gates, wherein the re-programmable gates are configured as a read-only memory (ROM) to store a syndrome decode memory table, wherein the syndrome decode memory table is configured to perform bit error correction on the data stream being read and/or written to the plurality of memory devices via the first interface; and wherein the data stream communicates to the host via the second interface.

Notably, reference herein to "one embodiment" or "an embodiment" means that a particular feature, structure, or characteristic described in connection with the embodiment may be included, employed and/or incorporated in one, some or all of the embodiments of the present disclosure. As explained above, the usages or appearances of the phrase "in one embodiment" or "in another embodiment" in the specification are not referring to the same embodiment, nor are separate or alternative embodiments necessarily mutually exclusive of one or more other embodiments, nor limited to a single exclusive embodiment. The same applies to the terms "implementation", "aspect", or "instance". The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Further, as indicated above, an embodiment or implementation described herein as "exemplary" is not to be construed as preferred or advantageous, for example, over other embodiments or implementations; rather, it is intended convey or indicate the embodiment or embodiments are example embodiment(s).

The terms "comprise," "include," "have" and any variations thereof (for example, "comprising," "including" and "having") are used synonymously to denote or describe non-exclusive inclusion. As such, a process, method, article and/or apparatus that uses such terms to, for example, describe a recipe, configuration and/or contents, does not include only those steps, structures and/or elements but may include other steps, structures and/or elements not expressly identified, listed or inherent to such process, method, article or apparatus.

Further, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

The foregoing description of the inventions has been described for purposes of clarity and understanding. It is not intended to limit the inventions to the precise form disclosed. Various modifications may be possible within the scope and equivalence of the application.

What is claimed is:

1. A device configured to perform bit error correction on a data stream, comprising:
 a plurality of memory devices;
 a first interface; and
 a field programmable gate array, wherein the field programmable gate array comprises a memory controller and a plurality of re-programmable gates, wherein at least one of the re-programmable gates is configured as a read-only memory (ROM) to store a syndrome decode memory table, and wherein the syndrome decode memory table is configured to perform bit error correction on the data stream being read and/or written to at least one memory device of the plurality of memory devices.

2. The device of claim 1, wherein the memory controller includes a plurality of encoders, wherein at least one encoder is configured to generate a first error encryption code based on the data stream when the memory controller performs a read operation.

3. The device of claim 1, wherein the memory controller includes a plurality of encoders, wherein at least one encoder is configured to generate a first error encryption code based on the data stream when the memory controller performs a read operation, and
 wherein the memory controller further includes a plurality of decoders, wherein each of the decoders are configured to generate a second error encryption code based on the data stream when the memory controller performs a write operation.

4. The device of claim 1, wherein the memory controller includes a plurality of encoders, wherein at least one encoder is configured to generate a first error encryption code based on the data stream when the memory controller performs a read operation,
 wherein the memory controller further includes a plurality of decoders, wherein at least one decoder is configured to generate a second error encryption code based on the data stream when the memory controller performs a write operation, and
 wherein each of the decoders is further configured to perform an Exclusive OR (XOR) operation of the first error encryption code and the second encryption code to generate a syndrome code.

5. The device of claim 1, wherein the memory controller includes a plurality of encoders, wherein at least one encoder is configured to generate a first error encryption code based on the data stream when the memory controller performs a read operation,
 wherein the memory controller further includes a plurality of decoders, wherein at least one decoder is configured to generate a second error encryption code based on the data stream when the memory controller performs a write operation,
 wherein each of the decoders is further configured to perform an Exclusive OR (XOR) operation of the first error encryption code and the second encryption code to generate a syndrome code, and
 wherein the syndrome code is configured as an input signal to the syndrome decode memory table, wherein the syndrome decode memory table generates an output signal comprising a plurality of bits based on the syndrome code, and wherein the output signal identifies up to two correctable bit errors within the data stream.

6. The device of claim 5, wherein the output signal comprises nineteen bits and is configured to identify up to two correctable bit errors within the data stream.

7. The device of claim 5, wherein the output signal comprises fifteen bits and is configured to identify up to two correctable bit errors within the data stream.

8. The device of claim 5, wherein the output signal comprises fourteen bits and is configured to identify up to two correctable bit errors within the data stream.

9. The device of claim 1, wherein the data stream is 128 bits wide.

10. A system configured to perform a bit error correction on a data stream, comprising:
 a host;
 a plurality of memory devices;
 a first interface;
 a second interface; and
 a field programmable gate array, wherein the field programmable gate array comprises a memory controller and a plurality of re-programmable gates, wherein at least one re-programmable gate is configured as a read-only memory (ROM) to store a syndrome decode memory table, wherein the syndrome decode memory table is configured to perform bit error correction on the data stream being read and/or written to the plurality of memory devices via the first interface, and wherein the data stream communicates to the host via the second interface.

11. The system of claim 10, wherein the memory controller includes a plurality of encoders, wherein at least one encoder is configured to generate a first error encryption code based on the data stream when the memory controller performs a read operation.

12. The system of claim 10, wherein the memory controller includes a plurality of encoders, wherein at least one encoder is configured to generate a first error encryption code based on the data stream when the memory controller performs a read operation, and
 wherein the memory controller further includes a plurality of decoders, wherein at least one encoder is configured to generate a second error encryption code based on the data stream when the memory controller performs a write operation.

13. The system of claim 10, wherein the memory controller includes a plurality of encoders, wherein at least one encoder is configured to generate a first error encryption code based on the data stream when the memory controller performs a read operation, wherein the memory controller further includes a plurality of decoders, wherein at least one decoder is configured to generate a second error encryption code based on the data stream when the memory controller performs a write operation, and wherein each of the decoders is further configured to perform an Exclusive OR (XOR) operation of the first error encryption code and the second encryption code to generate a syndrome code.

14. The system of claim 10, wherein the memory controller includes a plurality of encoders, wherein at least one encoder is configured to generate a first error encryption code based on the data stream when the memory controller performs a read operation, wherein the memory controller further includes a plurality of decoders, wherein at least one decoder is configured to generate a second error encryption code based on the data stream when the memory controller performs a write operation, wherein each of the decoders is further configured to perform an Exclusive OR (XOR) operation of the first error encryption code and the second encryption code to generate a syndrome code, and wherein the syndrome code is configured as an input signal to the syndrome decode memory table, wherein the syndrome decode memory table generates an output signal comprising a plurality of bits based on the syndrome code, and wherein the output signal identifies up to two correctable bit errors within the data stream.

15. The system of claim 14, wherein the output signal comprises nineteen bits and is configured to identify up to two correctable bit errors within the data stream.

16. The system of claim 14, wherein the output signal comprises fifteen bits and is configured to identify up to two correctable bit errors within the data stream.

17. The system of claim 14, wherein the output signal comprises fourteen bits and is configured to identify up to two correctable bit errors within the data stream.

18. The system of claim 10, wherein the data stream is 128 bits wide.

19. The system of claim 10, wherein the second interface comprises an expansion slot of the host.

20. The system of claim 10, wherein the second interface comprises a peripheral component interconnect express interface.

* * * * *